United States Patent [19]

Caruthers

[11] Patent Number: 4,626,834

[45] Date of Patent: Dec. 2, 1986

[54] GROUND CONTINUITY MONITOR FOR TOOL STOP CONTROLLERS

[75] Inventor: Roy E. Caruthers, Bay City, Tex.

[73] Assignee: Daniel Woodhead, Inc., Northbrook, Ill.

[21] Appl. No.: 657,333

[22] Filed: Oct. 3, 1984

[51] Int. Cl.$^4$ ............................................. G08B 21/00
[52] U.S. Cl. ................................... 340/649; 340/657; 324/51; 361/56
[58] Field of Search ............... 340/649, 650, 657, 651, 340/653, 654; 324/51, 133; 361/46, 50, 54, 55, 56

[56] References Cited

U.S. PATENT DOCUMENTS 4,298,864 11/1981 Mahnke et al. ...................... 340/657

*Primary Examiner*—Charles A. Ruehl
*Assistant Examiner*—Jeffery A. Hofsass
*Attorney, Agent, or Firm*—Emrich & Dithmar

[57] ABSTRACT

A ground continuity monitor for a tool stop controller includes a pair of resistive conductors connected in series between the power line hot and neutral leads. At the junction therebetween they are connected to the ground lead and to a controllable shunt. The resistive conductors maintain a sufficient voltage at the junction to hold the shunt in a conducting state until the junction is connected to ground through a low impedance, preferably less than substantially 100 ohms. An indicator, such as a lamp, indicates the state of conduction of the shunt, thereby providing the tool operator with an indication of the actual electrical continuity of the ground path from the tool ground lead back to ground at the power line source. In the event of a ground fault, no high voltage is imposed by the monitor on the tool case.

6 Claims, 2 Drawing Figures

GROUND CONTINUITY MONITOR FOR TOOL STOP CONTROLLERS

BACKGROUND OF THE INVENTION

The present invention relates to power tools, and more particularly to stop controllers which are used for stopping the operation of power tools, such as boring tools, when the tool comes into contact with metal embedded within a building structure. The metal could be structural metal, reinforcing rod, conduit, high voltage wires, or the like.

In the building and construction industries it is frequently necessary during construction and backfit operations to drill and/or cut into existing structures, whether buildings, building walls, building slabs, pavement, etc. Many, if not most, of these structures contain embedded metal. The metal may be reinforcing steel, structural steel, duct work, plaster lath, water pipes, drain pipes, gas pipes, electrical conduits, electrical wires themselves, and so forth. It is, of course, very important to stop the operation of such a tool the very moment it contacts such a metallic object, before the cutting bit of the tool can cause damage to either the metal object or to the tool bit itself. Not only should such building structural and service elements be protected from damage, but even more importantly, the risk to the tool operator of electrical shock from penetrated electrical lines or conduit, of gas explosions from penetrated gas lines, and so forth, must be minimized. A quick response is also of great importance to lessen the risk of worker accidents or injury from a tool which might otherwise slip or jump from the operator's control when a still moving tool bit suddenly becomes bound in embedded metal in the building structure.

In certain tool stop controller designs, a circuit interrupter or power circuit shutdown device includes circuitry which is actually interposed in the line between the power line ground and the tool ground. A typical example is shown in U.S. Pat. No. 3,386,004 (Dwyer, issued May 28, 1968). Circuitry such as described therein detects contact of the tool with embedded structural metal by placing a low impedance, low voltage source on the tool ground line and then detecting equipment ground lead undervoltage caused by subsequent tool contact with the embedded metal. Upon detecting such contact, the protection circuit is quickly actuated to stop operation of the tool by interrupting transmission of further power thereto. Frequently, the protection circuit also restores the ground circuit connection upon such a shutdown.

With many such tools, a proper connection to the original ground at the power source is necessary for protecting the tool operator by sinking leakage and fault currents. When used with many such tool stop controllers, such a proper connection to the power source ground is also necessary for providing the voltage reference for the associated tool stop controller shutdown circuitry. Even if the tool stop controller circuit is of a type wherein the ground circuit from the tool housing to the power line ground is not directly interrupted by the stop controller circuit, it is still obviously very important to maintain ground circuit continuity for sinking leakage and fault currents (and, depending upon the circuit design, ground circuit continuity may still be necessary for proper circuit operation).

As is well known, the transmitted power (e.g., 120 VAC) in a single phase, three conductor power line is applied across the hot and neutral lines (or leads). Both the neutral and ground leads are connected to earth ground at the power line source (and often at additional locations along the line as well). The ground lead is intended for safety purposes and normally does not carry any current.

To fulfill this safety purpose, the ground lead is ordinarily connected to the power tool housing, and preferably to other exposed metallic parts of the power equipment. Upon contact with energized building or structural metal, or upon internal failure within the tool itself, voltages impressed upon the tool housing will then ordinarily be conducted to ground by the ground lead, protecting the tool operator from dangerous exposure thereto. Obviously therefore, overall proper operation of the tool stop controller is dependent upon the integrity of the ground connection through the power line ground lead.

Ground fault detectors are well known, of course. Perhaps the simplest is a mere neon lamp and load resistor connected in series between the hot and ground leads. Should the ground lead fail, the lamp will fail to light. However, in such a simple circuit an illuminated lamp does not always mean that the ground lead connection is good. For example, the lamp will also usually light if the circuit is miswired, as by reversing the hot and ground leads. Therefore, more sophisticated detectors have been devised, such as shown and described in U.S. Pat. No. 4,298,864 (Mahnke et al., issued Nov. 3, 1981).

When viewed from the environment of tool stop controllers, however, many of the newer and more sensitive detectors have also proved to be unsatisfactory. That is, if another ground path is present, even if of high impedance, such as through the body of a worker contacting the tool housing, a "good" or "safe" indication will often be provided even though the actual ground lead is faulty (open circuited). In some cases also, an unsafe voltage may be imposed upon the tool housing by the detector circuitry once the ground lead becomes faulty, thereby exposing the tool operator to a potentially hazardous shock.

A need therefore remains for an improved ground continuity monitor particularly well adapted for use with tool stop controllers. Such a tool stop controller ground continuity monitor should be able, independently of the controller, to monitor the proper continuity of the equipment ground lead back to the power line source. Such a monitor should also be able to distinguish correctly between a proper low impedance ground path to the power line source and a false high impedance path through a worker's hand and body to ground if the equipment ground path is open. In the latter case, wherein the equipment ground path is open, the monitor circuit should impose no more than a relatively safe, low voltage, high impedance signal on the tool case and tool operator. Such a monitor should also provide an indication when the proper ground continuity is present. Further, it should preferably be able as well to monitor problems associated with miswiring from the power supply, such as reversed polarity, open neutral or hot, and reversed hot and ground, as well as the open ground condition itself.

SUMMARY OF THE INVENTION

Briefly, the present invention meets the above needs and purposes with a ground continuity monitor for tool stop controllers which distinguishes correctly between a low impedance ground path to the power line source and a false high impedance path through a worker's hand and body to ground (such as when the equipment ground path is open). In the latter case, wherein the proper low impedance equipment ground path is missing, the monitor circuit imposes no more than a relatively safe, low voltage, high impedance signal on the tool case and tool operator.

More specifically, the present invention provides a pair of resistive conductors connected in series between the power line hot and neutral leads. In the preferred embodiment of the invention, the resistive conductor which is connected (through a load resistor and a blocking diode) to the hot lead is a feedback resistor, and the resistive conductor which is connected between the feedback resistor and the power line neutral lead (through a blocking diode) is a bias resistor. Connected to the junction between the feedback and bias resistors is the base of a transistor. The transistor is a principal element in a controllable shunt circuit, the latter being controlled by the voltage on the junction between the resistive conductors. The transistor is connected for conduction between the power line hot and neutral leads. In the preferred embodiment the emitter of the transistor is connected to the power line neutral lead and the collector of the transistor has a load resistor connecting it to the power line hot lead. Thus the state of conduction of the transistor is controlled according to the bias on the transistor base applied from the junction between the resistive conductors.

The impedances of the resistive conductors are therefore selected so that their ratio furnishes a voltage at the junction therebetween which maintains the transistor in a first, essentially non-conducting state when the junction between the resistive conductors is electrically connected to the power line ground through a low impedance (where "low", in the preferred embodiment, is a resistance substantially less than 1000 ohms). Likewise, the impedances of the resistive conductors are also selected to maintain the transistor in a second, essentially conducting state when the junction between the resistive conductors is electrically connected to the power line ground only through a high impedance (where "high", in the preferred embodiment, is a resistance greater than about 1000 ohms). As explained further below, in the preferred embodiment the transistor is considered to be in the second ("conducting") state when it is conducting sufficient current to maintain a base-to-collector voltage of no more than about 70 volts (the voltage being dropped across the load resistor between the collector and the power line hot lead). The transistor is considered to be in the first ("non-conducting") state when it is conducting so little current that the base-to-collector voltage will be greater than about 70 volts. In this manner the tool stop controller ground continuity monitor is readily able to distinguish between a proper low impedance path in the ground lead to the power line ground and a false high impedance path to ground through the hand and body of an operator in contact with the tool if the equipment ground path is open.

An indicator lamp is connected to the controllable shunt circuit for monitoring the condition of the ground path from the tool ground lead back to the power line ground, and for giving the tool operator an indication of the true condition of the ground path. The indicator lamp is connected in parallel with the transistor, forming a parallel circuit therewith, and this parallel circuit is connected in series with the load resistor mentioned earlier, so that the transistor controls the voltage across the lamp. By this means the lamp is lit when the transistor is non-conducting (as defined above), and is extinguished when the transistor is conducting. The lamp is extinguished because the transistor, when conducting, limits the voltage across the lamp to less than the trigger voltage necessary for it to light. The lamp therefore lights when the equipment ground lead is properly connected to the power line ground through a low impedance, and remains unlit when the circuit is open, even though the tool operator's body may be providing a leakage (high impedance) path to ground.

A trio of blocking diodes is included in the invention to help keep the lamp extinguished in case of miswiring of the power line leads. One is in the line connecting the neutral lead to the emitter of the transistor, one in the line connecting the hot lead to the collector of the transistor, and the third in the line connecting the power line ground lead to the junction between the bias and feedback resistors. The third blocking diode is thus also in the line connecting the power line ground lead to the base of the transistor. This ordinarily keeps the transistor in the shunt circuit in its conducting state in cases of miswiring, so that the lamp current is shunted around the lamp and the lamp does not light.

The blocking diodes provide an additional advantage. In the event that the equipment ground path is substantially open, they drop the reverse polarity voltage so that the voltage measured on the equipment ground lead in that case is very low. By imposing only a low voltage, high impedance signal on the tool, the tool operator is protected in case of contact therewith.

It is therefore an object of the present invention to provide an improved ground continuity monitor for tool stop controllers; a stop controller monitor which will provide a true indication of the electrical continuity of the ground path from the tool ground lead back to the power line ground; which will distinguish between a proper low impedance ground path therethrough and a false high impedance path such as through the body of an operator in contact with the tool; which will impose only a low voltage, high impedance signal on the tool in the event that the equipment ground path is substantially open, to protect the tool operator in case of contact therewith; which includes a controllable shunt connected for conduction between the power line hot and neutral leads; which includes first and second resistive conductors connected in series between the power line hot and neutral leads, and connected at the junction therebetween to the controllable shunt for controlling the shunt; wherein the first and second resistive conductors have predetermined values which maintain a voltage at the junction such that the controllable shunt is maintained in a first predetermined state of conduction when the junction is electrically connected through a low impedance to the power line ground, and such that, due to a sufficient current flow through the resistive conductors, the controllable shunt is maintained in a second predetermined state of conduction when the junction is electrically connected through a high impedance to the power line ground; which includes an indicator for providing an indication of the state of conduction of the shunt; which may include blocking diodes in the lines connecting the controllable shunt to the power line hot, neutral, and ground leads for holding the shunt in the second state of conduction in response to miswiring of the power line leads, and imposing only a low voltage, high impedance signal on the tool in the event that the equipment ground path is substantially open; and to accomplish the above objects and purposes in an economical, durable, efficient, reliable, and versatile method and apparatus capable of operating cooperatively along with such tool stop controllers independently of interference with the operation thereof, and readily suited therefore to the widest possible application and utilization in the building and construction industries.

Other objects and advantages of the invention will be apparent from the following description, the accompanying drawings and the appended claims.

DESCRIPTION OF THE PREFERRED EMBODIMENT

Figure 1:
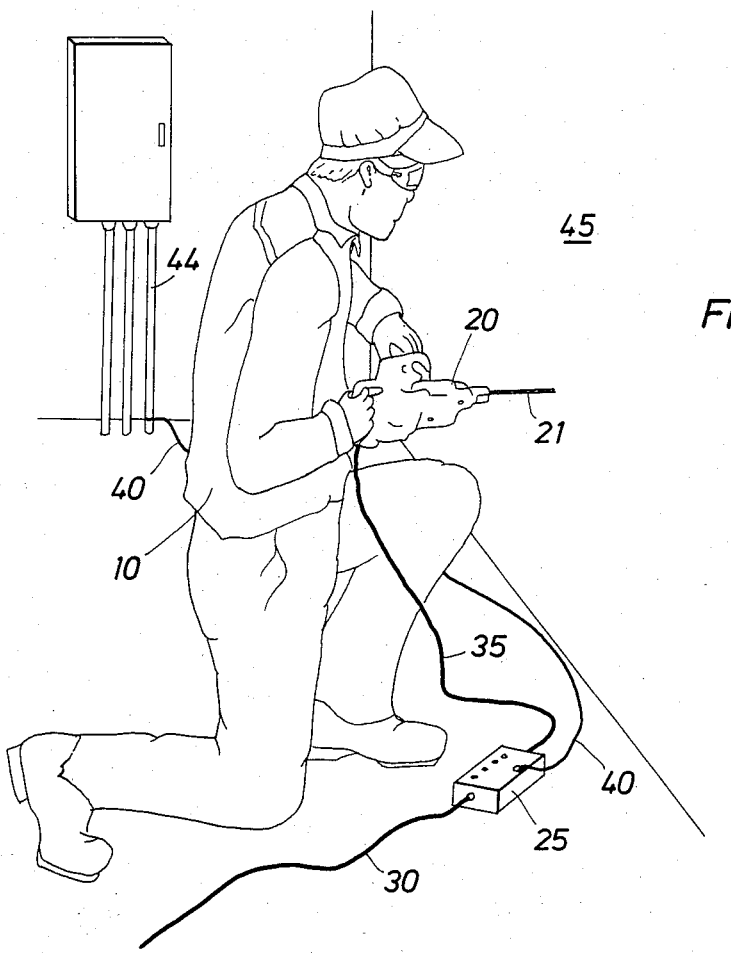
FIG. 1 is a figurative illustration showing a tool operator using the present invention in conjunction with a boring tool.

With reference to the drawings, the new and improved ground continuity monitor for tool stop controllers, and the method therefor according to the present invention, will be described. FIG. 1 shows a worker or tool operator 10 operating a tool 20, which for purposes of illustration is shown as a conventional electric drill 20 having a bit 21. Electrical power for tool 20 is controlled by a metal contact tool stop controller 25 which is located between the conventional 120 volt AC power line 30 (having a hot lead 31, a neutral lead 32, and a power line ground lead 33—see FIG. 2) and the tool power line 35. A separate grounding lead 40 may be run from controller 25 to local exposed metal 44 in the building structure 45 upon which the operator 10 is working. As discussed earlier, the tool stop controller 25 functions to effect an immediate, automatic shutdown of tool 20 upon contact with metal in the building structure 45.

It should be noted that the "structure" referred to within the context of the present invention may be any type of construction, such as a cement slab, a section of highway, etc. Also, higher voltage sources and multiphase connections may be used with appropriate modifications, as will be readily apparent to those skilled in the art. Additionally, if the tool 20 is hydraulically or pneumatically powered, the power leads from the controller 25 may be connected to an AC solenoid valve in the hydraulic or pneumatic supply line to the tool, and the equipment ground lead from the controller 25 will then be connected, for example, directly to the case of the hydraulic or pneumatic tool.

As discussed earlier, a good and proper connection from the tool and its ground lead to the power line ground is important both for sinking leakage and fault currents as well as for providing the voltage reference for the tool stop controller detection circuitry. The preferred functional schematic diagram of the ground continuity monitor 50 for effecting this function according to the present invention is shown in FIG. 2.

Figure 2:
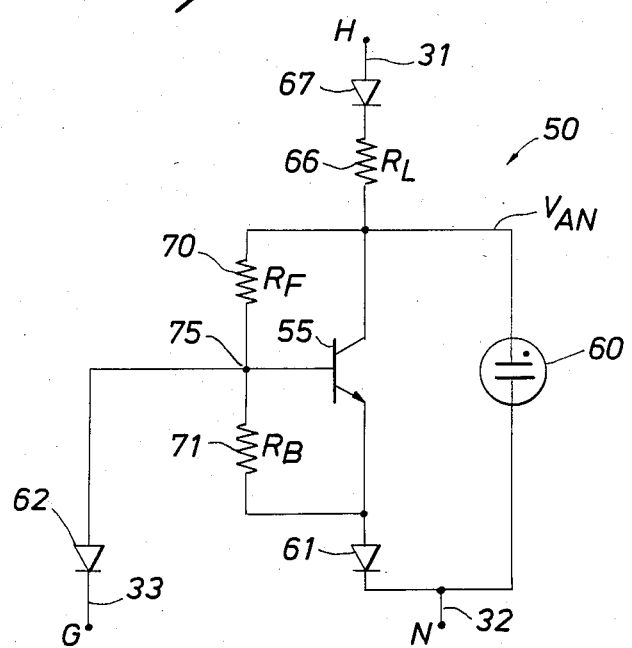
FIG. 2 is an electrical schematic diagram of the preferred embodiment of the invention.

As shown in FIG. 2, the electrical power source (the 120 volt AC power line 30), which provides the operating power and the control voltage for the tool 20 and the controller 25, also supplies power for the monitor 50. Monitor 50, which produces little heat and is compact enough to be located in a power line cord cap if desired, is illustrated herein as being contained integrally within the housing of the tool stop controller 25. Monitor 50 includes a transistor 55 which serves as the controllable element in a shunt circuit connected in parallel with a neon indicator lamp 60. The emitter of transistor 55 is connected to the power line neutral lead 32 through a first blocking diode 61. The base of transistor 55 is connected to the power line ground lead 33 through a second blocking diode 62. The collector of transistor 55 is connected to the power line hot lead 31 through a load resistor 66 (also denoted $R_L$), and a third blocking diode 67. The blocking diodes 61, 62, and 67 effectively prevent the lamp from lighting if the power line leads should be miswired.

Connected in parallel with transistor 55, and thus between the power line hot and neutral leads 31 and 32 (through load resistor 66), are first and second resistive conductors 70 and 71. Resistive conductor 70 is a feedback resistor (also denoted $R_F$), and resistive conductor 71 is a bias resistor (also denoted $R_B$). The junction 75 between resistors 70 and 71 is connected to the base of transistor 55 and to blocking diode 62, for controlling the transistor according to the bias maintained upon junction 75 by the resistive conductors 70 and 71. As will be seen, transistor 55 and resistors 70 and 71 form a controllable shunt circuit in parallel with the indicator lamp 60. Then, when transistor 55 is in a conducting state, the shunt circuit shunts the current around lamp 60 so that the voltage drop across load resistor 66 leaves insufficient voltage to light lamp 60.

More specifically, it will be appreciated that, in order for the neon indicator lamp 60 to light, its terminal voltage $V_{AN}$ (which is also the voltage across transistor 55) must exceed the lamp's trigger voltage at some point in the AC voltage cycle. Resistor 66 acts as a load resistor for both lamp 60 and transistor 55, transistor 55 being the controllable element in the shunt circuit. In the preferred embodiment, the values of the feedback and bias resistors 70 and 71 are chosen, for purposes of circuit stability, such that their ratio is about 100:1 and their sum is large enough to allow the neon lamp to trigger when transistor 55 is off ("non-conducting").

As transistor 55 transitions from the non-conducting to the conducting state, it will limit $V_{AN}$ (the voltage across the lamp) to a value of $R \times V_{be}$, where R is the ratio of the feedback to bias resistors 70 and 71, and $V_{be}$ is the base to emitter voltage of the transistor 55. During this transition, the base to emitter voltage, in the preferred embodiment, increases rapidly from 0 volts to a stable 0.7 volts. $V_{AN}$, consequently, will be limited to about 70 volts, which is less than the approximately 135 volts typically required to trigger a commercial, high brightness neon lamp. These conditions obtain, of course, when the connection from junction 75 to the power line ground lead 33 is open.

When the connection from junction 75 to ground is not entirely open, then a current path will exist in parallel with the bias resistor 71. This current path may have a resistance which varies from nearly zero (good connection to the power line ground), to several thousand ohms (when the connection is through a person's skin), to infinite (open ground circuit). A resistance in this current path less than infinite will have the net electrical effect of reducing the effective bias resistance between the emitter and the base of the transistor. This, in turn, causes the ratio R to increase. As R increases, $V_{AN}$ increases. At the desired, predetermined point, the neon indicator lamp 60 is then allowed to trigger. Since the effective bias resistance is altered in this manner by the ground-to-neutral circuit, the value of resistor 71 can be easily adjusted to yield the response desired for the low values required for the invention.

The maximum voltage which can ordinarily be placed on a worker such as tool operator 10, when the connection from the monitor circuit 50 to the power line ground 33 is open circuited, is essentially clamped by the transistor's $V_{be}$ characteristics to an operator safe voltage of about 0.7 volts. The maximum current that is induced onto the worker in this case is limited by the load and feedback resistors 66 and 70 to the micro-amp range. This leakage current is not sufficient to trip ground fault interrupting circuits that may be employed at the power source.

The resistive conductors 70 and 71 therefore act as a voltage divider, dividing the voltage according to their ratio R, as discussed above. When values for resistors 70 and 71 are selected as set forth above (to have the proper response and sensitivity to relatively low resistances in the ground-neutral circuit), it follows that the resistors 70 and 71 will also be maintaining a current flow therethrough which is sufficient to maintain an operator safe voltage upon junction 75, and hence on the base of transistor 55, which keeps the transistor in a conducting state both when the lead connecting junction 75 through blocking diode 62 is open, and when it has a connection to ground through a high impedance. In the preferred embodiment, the latter will be the case, as already discussed above, when the connection is through a person's skin (having a resistance to low voltage of a few thousand ohms). Thus with proper value selection, transistor 55 will turn on and prevent lamp 60 from lighting at resistances as low as even 1 to 5 kilo-ohms between ground and neutral. Failure of lamp 60 to light then indicates an unsafe condition for the tool operator.

On the other hand, if the power line 30 is properly wired and junction 75 is connected to ground through a low resistance (substantially less than 1000 ohms in the preferred embodiment), transistor 55 will then be biased off and lamp 60 will light.

Typical component values for the resistive conductors in a circuit such as the preferred circuit shown in FIG. 2 are:

| Resistor | Resistance |
| --- | --- |
| Resistor 66 ($R_L$) | 39K ohms |
| Resistor 70 ($R_F$) | 330K ohms |
| Resistor 71 ($R_B$) | 3.3K ohms |

As may be seen therefore, the present invention has numerous advantages. By connecting the transistor shunt circuit in parallel with lamp 60, and the parallel shunt/lamp circuit in series with the load resistor 66, the transistor is able to control the lamp by shunting the lamp current as described above. Another advantage of the present invention is provided by the blocking diodes 61, 62, and 67, which drop the reverse polarity voltage so that the voltage measured on the tool ground lead, when open circuited with respect to the power line ground, is low. This is particularly important in commercial applications to avoid a reverse cycle high voltage over 42.4 volts (an OSHA defined hazardous voltage level), even through a high impedance source, onto the equipment ground lead which the tool operator is contacting.

The invention therefore provides an improved ground continuity monitor which is particularly well adapted for use with tool stop controllers. The invention is able, independently of such a controller, to monitor the proper continuity of the equipment ground lead back to the power line source. Further, it can distinguish correctly between a proper low impedance ground path to the power line source and a false high impedance path through a worker's hand and body to ground if the equipment ground path is open. Further, it is able to monitor problems associated with miswiring from the power supply, such as reversed polarity, open neutral or hot, and reversed hot and ground, as well as the open ground condition itself. The invention thus provides an uncomplicated, inexpensive, economical, durable, efficient, reliable, and versatile method and apparatus capable of operating cooperatively along with such tool stop controllers independently of interference with the operation thereof, and readily suited to the widest possible application and utilization in the building and construction industries.

While the methods and forms of apparatus herein described constitute preferred embodiments of this invention, it is to be understood that the invention is not limited to these precise methods and forms of apparatus, and that changes may be made therein without departing from the scope of the invention.

What is claimed is:

1. A ground continuity monitor for a tool stop controller for tools subject to operator contact, for indicating proper ground continuity through a power line having hot, neutral, and ground leads without presenting excessive voltages to the tool and its ground lead when the ground path is open circuited, and for distinguishing between a proper low impedance path in the ground lead and a false high impedance path to ground through the body of an operator in contact with the tool, comprising:

(a) controllable shunt means connected for conduction between the power line hot and neutral leads, (b) first and second resistive conductors connected in series between the power line hot and neutral leads, and connected at the junction therebetween to a control input of said controllable shunt means for controlling said shunt means, (c) said first and second resistive conductors having predetermined values such that the voltage at said junction therebetween maintains said controllable shunt means in a first predetermined state of conduction when said junction is electrically connected through a low impedance to the power line ground, and a second predetermined state of conduction when said junction is not connected to the power line ground, said first and second resistive conductor predetermined values also being such that a sufficient current flows therethrough to support an operator safe voltage at said junction which maintains said controllable shunt means in said second state of conduction when said junction is electrically connected through a high impedance to ground, and (d) indicator means for providing an indication of the state of conduction of said shunt means, for independently monitoring and providing a true indication of the electrical continuity of the ground path from the tool ground lead back to the power line ground, and for distinguishing between a proper low impedance ground path therethrough and a false, high impedance path such as through the body of an operator in contact with the tool, and (e) a blocking diode connected in the line connecting the neutral lead to said controllable shunt means, a blocking diode connected in the line connecting the hot lead to said controllable shunt means, and a blocking diode connected in the line connecting the power line ground lead to said junction, for holding said controllable shunt means in said second state of conduction in response to miswiring of the power line leads, and, in the event that the equipment ground path is substantially open, imposing only a low voltage, high impedance signal on the tool, to protect the tool operator in case of contact therewith.

2. The device of claim 1 wherein said first predetermined state is a substantially non-conducting state and said second predetermined state is a substantially conducting state.

3. The device of claim 1 wherein said controllable shunt means is a transistor connected in series with a load resistance between the power line hot and neutral leads, and wherein the base thereof is connected to said junction for controlling said transistor according to the bias thereon.

4. The device of claim 1 wherein said indicator means is a lamp means for providing an indication to the operator of the continuity of the ground path.

5. The device of claim 4 wherein said indicator lamp means and said shunt means are connected in parallel to form a parallel circuit, and said parallel circuit is connected in series with a load resistance, for causing said lamp means to light when said shunt means is substantially non-conducting, and for extinguishing said lamp means when said shunt means is substantially conducting.

6. A ground continuity monitor for a tool stop controller for tools subject to operator contact, for indicating proper ground continuity through a power line having hot, neutral, and ground leads without presenting excessive voltages to the tool and its ground lead when the ground path is open circuited, and for distinguishing between a proper low impedance path in the ground lead and a false high impedance path to ground through the body of an operator in contact with the tool, comprising:

(a) controllable shunt means including a transistor connected for conduction between the power line hot and neutral leads, the emitter of the transistor being connected to the power line neutral lead, and the collector of the transistor having a load resistor connecting the collector to the power line hot lead, (b) first and second resistive conductors connected in series between the power line hot and neutral leads, and connected at the junction therebetween to the base of said transistor for controlling the state of conduction of said transistor according to the bias thereon, (c) said first and second resistive conductors having predetermined values such that the voltage at said junction therebetween maintains said transistor in a first substantially non-conducting state when said junction is electrically connected to the power line ground through an impedance of less than substantially 1000 ohms, and in a second substantially conducting state when said junction is electrically connected to ground through an impedance of at least substantially 1000 ohms, (d) lamp indicator means connected in parallel with said transistor to form a parallel circuit therewith, and said parallel circuit being connected in series with a load resistor, for causing said lamp means to light when said transistor is substantially non-conducting, and for extinguishing said lamp means when said transistor is substantially conducting, for independently monitoring and providing a true indication of the electrical continuity of the ground path from the tool ground lead back to the power line ground, and for distinguishing between a proper low impedance ground path therethrough and a false, high impedance path such as through the body of an operator in contact with the tool, and (e) a blocking diode connected in the line connecting the neutral lead to the emitter of said transistor, a blocking diode connected in the line connecting the hot lead to the collector of said transistor, and a blocking diode connected in the line connecting the power line ground lead to said junction and the base of said transistor, for holding said transistor in said second conducting state in response to miswiring of the power line leads, and, in the event that the equipment ground path is substantially open, imposing only a low voltage, high impedance signal on the tool, to protect the tool operator in case of contact therewith.

* * * * *